United States Patent
Minami et al.

(10) Patent No.: US 7,323,073 B2
(45) Date of Patent: Jan. 29, 2008

(54) PIEZOELECTRIC PORCELAIN COMPOSITION, LAMINATED PIEZOELECTRIC DEVICE THEREFROM AND PROCESS FOR PRODUCING THE SAME

(75) Inventors: Seiichi Minami, Osaka (JP); Yasushi Goto, Osaka (JP); Kazuhiro Okuda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/489,710

(22) PCT Filed: Jun. 2, 2003

(86) PCT No.: PCT/JP03/06919

§ 371 (c)(1),
(2), (4) Date: Mar. 15, 2004

(87) PCT Pub. No.: WO03/104163

PCT Pub. Date: Dec. 18, 2003

(65) Prior Publication Data

US 2004/0238100 A1 Dec. 2, 2004

(30) Foreign Application Priority Data

Jun. 5, 2002 (JP) .............................. 2002-163939

(51) Int. Cl.
*C03B 29/00* (2006.01)
(52) U.S. Cl. ................. 156/89.14; 156/89.16
(58) Field of Classification Search ............. 156/89.12, 156/89.14, 89.16, 89.17; 252/62.9 PZ, 62.9 R; 310/311, 358; 501/134, 135, 136
See application file for complete search history.

(56) References Cited

U.S. PATENT DOCUMENTS

| | | | | |
|---|---|---|---|---|
| 3,686,414 A | * | 8/1972 | Koe ............................ | 514/567 |
| 3,728,263 A | * | 4/1973 | Nishida et al. ........ | 252/62.9 PZ |
| 3,998,748 A | * | 12/1976 | Nishida et al. ........ | 252/62.9 PZ |
| 4,024,081 A | * | 5/1977 | Ohmori et al. ........ | 252/62.9 PZ |
| 4,812,426 A | * | 3/1989 | Takagi et al. ............... | 501/136 |
| 5,196,757 A | * | 3/1993 | Omatsu ..................... | 310/358 |
| 5,994,822 A | * | 11/1999 | Kondo et al. ............... | 310/358 |
| 6,078,127 A | * | 6/2000 | Saito et al. .................. | 310/363 |
| 6,207,069 B1 | * | 3/2001 | Furukawa et al. ..... | 252/62.9 PZ |
| 6,230,378 B1 | * | 5/2001 | Cramer et al. ............. | 29/25.35 |
| 6,322,718 B1 | * | 11/2001 | Dai et al. ............. | 252/62.9 PZ |
| 6,413,443 B1 | * | 7/2002 | Furukawa et al. ..... | 252/62.9 PZ |
| 2004/0072670 A1 | * | 4/2004 | Kasukawa et al. .......... | 501/134 |

FOREIGN PATENT DOCUMENTS

| | | | |
|---|---|---|---|
| EP | 0 780 350 | * | 6/1997 |
| JP | 62-138354 | * | 6/1987 |

(Continued)

*Primary Examiner*—Melvin Mayes
(74) *Attorney, Agent, or Firm*—McDermott Will & Emery LLP

(57) ABSTRACT

A piezoelectric ceramic composition including three components, $Pb(Zn_{1/3}Nb_{2/3})O_3$, $PbTiO_3$, and $PbZrO_3$, and having a basic composition formula of $Pb(Zn_{1/3}Nb_{2/3})_x Zr_y Ti_z O_3$, where $0.90 < x+y+z < 1.0$, exhibits excellent piezoelectric characteristics and heat resistance and has a low sintering temperature of about 900° C., a coupling coefficient Kp not less than 0.50, and a Curie temperature not lower than 300° C. A piezoelectric device using this composition may employ inexpensive silver and silver-palladium alloys containing a high percentage of silver as material of an internal electrode, thus being inexpensive and having excellent characteristics.

9 Claims, 10 Drawing Sheets

FOREIGN PATENT DOCUMENTS

| | | | |
|---|---|---|---|
| JP | 7-235440 A | | 9/1995 |
| JP | 08-217539 | * | 8/1996 |
| JP | 8-333161 | * | 12/1996 |
| JP | 9-221359 | * | 8/1997 |
| JP | 10-7458 | | 1/1998 |
| JP | 2001-206767 | * | 7/2001 |
| JP | 2001-342062 A | | 12/2001 |
| JP | 2003-12369 | * | 1/2003 |

* cited by examiner

Fig. 1

| Sample No. | Pb (mol) | Zn$_{1/3}$Nb$_{2/3}$ x(mol) | Zr y(mol) | Ti z(mol) | x+y+z (mol) |
|---|---|---|---|---|---|
| 1 | 1.0 | 0.01 | 0.25 | 0.59 | 0.85 |
| 2 | 1.0 | 0.01 | 0.25 | 0.61 | 0.87 |
| 3 | 1.0 | 0.01 | 0.60 | 0.28 | 0.89 |
| 4 | 1.0 | 0.01 | 0.60 | 0.29 | 0.90 |
| 5 | 1.0 | 0.01 | 0.65 | 0.25 | 0.91 |
| 6 | 1.0 | 0.01 | 0.66 | 0.25 | 0.92 |
| 7 | 1.0 | 0.01 | 0.67 | 0.25 | 0.93 |
| 8 | 1.0 | 0.05 | 0.71 | 0.25 | 1.01 |
| 9 | 1.0 | 0.01 | 0.25 | 0.69 | 0.95 |
| 10 | 1.0 | 0.01 | 0.25 | 0.71 | 0.97 |
| 11 | 1.0 | 0.05 | 0.25 | 0.68 | 0.98 |
| 12 | 1.0 | 0.05 | 0.25 | 0.71 | 1.01 |
| 13 | 1.0 | 0.10 | 0.25 | 0.64 | 0.99 |
| 14 | 1.0 | 0.10 | 0.25 | 0.65 | 1.00 |
| 15 | 1.0 | 0.11 | 0.25 | 0.65 | 1.01 |
| 16 | 1.0 | 0.12 | 0.25 | 0.65 | 1.02 |

Fig. 2

| Sample No. | Sintering Temp. (°C) | Coupling Coefficient Kp | Curie Temp. (°C) |
|---|---|---|---|
| 1 | 820 | 0.27 | 347 |
| 2 | 820 | 0.36 | 345 |
| 3 | 840 | 0.37 | 346 |
| 4 | 830 | 0.46 | 348 |
| 5 | 860 | 0.51 | 347 |
| 6 | 840 | 0.52 | 347 |
| 7 | 850 | 0.52 | 342 |
| 8 | 1020 | 0.52 | 317 |
| 9 | 850 | 0.53 | 349 |
| 10 | 860 | 0.53 | 351 |
| 11 | 880 | 0.52 | 334 |
| 12 | 1000 | 0.52 | 321 |
| 13 | 900 | 0.54 | 323 |
| 14 | 960 | 0.55 | 320 |
| 15 | 1010 | 0.56 | 318 |
| 16 | 1050 | 0.56 | 311 |

Fig. 3

| Sample No. | Pb (mol) | $Zn_{1/3}Nb_{2/3}$ x(mol) | Zr y(mol) | Ti z(mol) | x+y+z (mol) |
|---|---|---|---|---|---|
| 17 | 1.0 | 0.008 | 0.45 | 0.47 | 0.928 |
| 18 | 1.0 | 0.009 | 0.45 | 0.47 | 0.929 |
| 19 | 1.0 | 0.010 | 0.45 | 0.47 | 0.93 |
| 20 | 1.0 | 0.011 | 0.45 | 0.47 | 0.931 |
| 21 | 1.0 | 0.012 | 0.45 | 0.47 | 0.932 |
| 22 | 1.0 | 0.015 | 0.50 | 0.45 | 0.965 |
| 23 | 1.0 | 0.020 | 0.50 | 0.45 | 0.97 |
| 24 | 1.0 | 0.050 | 0.45 | 0.45 | 0.95 |
| 25 | 1.0 | 0.10 | 0.44 | 0.44 | 0.98 |
| 26 | 1.0 | 0.10 | 0.45 | 0.40 | 0.95 |
| 27 | 1.0 | 0.15 | 0.45 | 0.35 | 0.95 |
| 28 | 1.0 | 0.17 | 0.45 | 0.35 | 0.97 |
| 29 | 1.0 | 0.19 | 0.45 | 0.35 | 0.99 |
| 30 | 1.0 | 0.20 | 0.44 | 0.34 | 0.98 |
| 31 | 1.0 | 0.21 | 0.44 | 0.34 | 0.99 |
| 32 | 1.0 | 0.22 | 0.43 | 0.33 | 0.98 |
| 33 | 1.0 | 0.15 | 0.22 | 0.58 | 0.95 |
| 34 | 1.0 | 0.15 | 0.24 | 0.58 | 0.97 |
| 35 | 1.0 | 0.15 | 0.25 | 0.55 | 0.95 |
| 36 | 1.0 | 0.15 | 0.26 | 0.55 | 0.96 |
| 37 | 1.0 | 0.15 | 0.28 | 0.55 | 0.98 |
| 38 | 1.0 | 0.10 | 0.35 | 0.50 | 0.95 |
| 39 | 1.0 | 0.10 | 0.40 | 0.48 | 0.98 |
| 40 | 1.0 | 0.10 | 0.45 | 0.43 | 0.98 |
| 41 | 1.0 | 0.10 | 0.55 | 0.33 | 0.98 |
| 42 | 1.0 | 0.10 | 0.57 | 0.30 | 0.97 |
| 43 | 1.0 | 0.10 | 0.59 | 0.30 | 0.99 |
| 44 | 1.0 | 0.05 | 0.60 | 0.33 | 0.98 |
| 45 | 1.0 | 0.05 | 0.61 | 0.33 | 0.99 |
| 46 | 1.0 | 0.03 | 0.63 | 0.33 | 0.99 |
| 47 | 1.0 | 0.02 | 0.65 | 0.32 | 0.99 |
| 48 | 1.0 | 0.15 | 0.55 | 0.22 | 0.92 |
| 49 | 1.0 | 0.15 | 0.55 | 0.24 | 0.94 |
| 50 | 1.0 | 0.15 | 0.55 | 0.25 | 0.95 |
| 51 | 1.0 | 0.15 | 0.55 | 0.26 | 0.96 |
| 52 | 1.0 | 0.15 | 0.55 | 0.27 | 0.97 |
| 53 | 1.0 | 0.10 | 0.55 | 0.30 | 0.95 |
| 54 | 1.0 | 0.10 | 0.45 | 0.40 | 0.95 |
| 55 | 1.0 | 0.10 | 0.37 | 0.50 | 0.97 |
| 56 | 1.0 | 0.05 | 0.37 | 0.55 | 0.97 |
| 57 | 1.0 | 0.05 | 0.37 | 0.57 | 0.99 |
| 58 | 1.0 | 0.03 | 0.37 | 0.59 | 0.99 |
| 59 | 1.0 | 0.02 | 0.37 | 0.60 | 0.99 |
| 60 | 1.0 | 0.02 | 0.35 | 0.61 | 0.98 |
| 61 | 1.0 | 0.02 | 0.33 | 0.63 | 0.98 |
| 62 | 1.0 | 0.02 | 0.32 | 0.65 | 0.99 |

Fig. 4

| Sample No. | Sintering Temp. (°C) | Coupling Coefficient Kp | Curie Temp. (°C) |
| --- | --- | --- | --- |
| 17 | 830 | 0.52 | 354 |
| 18 | 840 | 0.51 | 350 |
| 19 | 840 | 0.52 | 346 |
| 20 | 840 | 0.55 | 342 |
| 21 | 850 | 0.57 | 338 |
| 22 | 850 | 0.57 | 331 |
| 23 | 860 | 0.58 | 330 |
| 24 | 850 | 0.58 | 327 |
| 25 | 860 | 0.59 | 318 |
| 26 | 850 | 0.59 | 315 |
| 27 | 850 | 0.59 | 315 |
| 28 | 870 | 0.58 | 312 |
| 29 | 880 | 0.58 | 307 |
| 30 | 870 | 0.54 | 296 |
| 31 | 880 | 0.52 | 291 |
| 32 | 870 | 0.50 | 288 |
| 33 | 880 | 0.51 | 308 |
| 34 | 890 | 0.52 | 311 |
| 35 | 860 | 0.52 | 313 |
| 36 | 860 | 0.56 | 312 |
| 37 | 870 | 0.58 | 322 |
| 38 | 850 | 0.57 | 321 |
| 39 | 880 | 0.58 | 318 |
| 40 | 880 | 0.60 | 317 |
| 41 | 870 | 0.60 | 311 |
| 42 | 870 | 0.59 | 315 |
| 43 | 900 | 0.58 | 316 |
| 44 | 870 | 0.53 | 322 |
| 45 | 890 | 0.52 | 323 |
| 46 | 880 | 0.51 | 331 |
| 47 | 900 | 0.51 | 337 |
| 48 | 880 | 0.50 | 307 |
| 49 | 900 | 0.51 | 308 |
| 50 | 850 | 0.52 | 311 |
| 51 | 850 | 0.56 | 320 |
| 52 | 870 | 0.57 | 321 |
| 53 | 860 | 0.60 | 325 |
| 54 | 880 | 0.60 | 319 |
| 55 | 880 | 0.59 | 322 |
| 56 | 880 | 0.58 | 325 |
| 57 | 900 | 0.58 | 322 |
| 58 | 890 | 0.58 | 324 |
| 59 | 890 | 0.53 | 318 |
| 60 | 880 | 0.52 | 317 |
| 61 | 880 | 0.52 | 316 |
| 62 | 900 | 0.51 | 317 |

Fig. 5

| Sample No. | Pb (mol) | $Zn_{1/3}Nb_{2/3}$ x(mol) | Zr y(mol) | Ti z(mol) | x+y+z (mol) | $SnO_2$ (wt%) | $MnO_2$ (wt%) |
|---|---|---|---|---|---|---|---|
| 63 | 1.0 | 0.10 | 0.43 | 0.45 | 0.98 | 0.01 | 0 |
| 64 | 1.0 | 0.10 | 0.43 | 0.45 | 0.98 | 0.05 | 0 |
| 65 | 1.0 | 0.10 | 0.43 | 0.45 | 0.98 | 0.10 | 0 |
| 66 | 1.0 | 0.10 | 0.43 | 0.45 | 0.98 | 0.15 | 0 |
| 67 | 1.0 | 0.10 | 0.43 | 0.45 | 0.98 | 0.30 | 0 |
| 68 | 1.0 | 0.10 | 0.43 | 0.45 | 0.98 | 0.50 | 0 |
| 69 | 1.0 | 0.10 | 0.37 | 0.50 | 0.97 | 1.0 | 0 |
| 70 | 1.0 | 0.10 | 0.37 | 0.50 | 0.97 | 1.5 | 0 |
| 71 | 1.0 | 0.10 | 0.55 | 0.33 | 0.98 | 1.7 | 0 |
| 72 | 1.0 | 0.10 | 0.55 | 0.33 | 0.98 | 1.9 | 0 |
| 73 | 1.0 | 0.10 | 0.55 | 0.33 | 0.98 | 2.0 | 0 |
| 74 | 1.0 | 0.10 | 0.55 | 0.33 | 0.98 | 2.1 | 0 |
| 75 | 1.0 | 0.10 | 0.55 | 0.33 | 0.98 | 2.3 | 0 |
| 76 | 1.0 | 0.10 | 0.43 | 0.45 | 0.98 | 0 | 0.01 |
| 77 | 1.0 | 0.10 | 0.43 | 0.45 | 0.98 | 0 | 0.05 |
| 78 | 1.0 | 0.10 | 0.43 | 0.45 | 0.98 | 0 | 0.10 |
| 79 | 1.0 | 0.10 | 0.43 | 0.45 | 0.98 | 0 | 0.15 |
| 80 | 1.0 | 0.10 | 0.43 | 0.45 | 0.98 | 0 | 0.30 |
| 81 | 1.0 | 0.10 | 0.43 | 0.45 | 0.98 | 0 | 0.50 |
| 82 | 1.0 | 0.10 | 0.37 | 0.50 | 0.97 | 0 | 1.0 |
| 83 | 1.0 | 0.10 | 0.37 | 0.50 | 0.97 | 0 | 1.5 |
| 84 | 1.0 | 0.10 | 0.55 | 0.33 | 0.98 | 0 | 1.7 |
| 85 | 1.0 | 0.10 | 0.55 | 0.33 | 0.98 | 0 | 1.9 |
| 86 | 1.0 | 0.10 | 0.55 | 0.33 | 0.98 | 0 | 2.0 |
| 87 | 1.0 | 0.10 | 0.55 | 0.33 | 0.98 | 0 | 2.1 |
| 88 | 1.0 | 0.10 | 0.55 | 0.33 | 0.98 | 0 | 2.3 |

Fig. 6

| Sample No. | Sintering Temp. (°C) | Coupling Coefficient Kp | Curie Temp. (°C) |
|---|---|---|---|
| 63 | 880 | 0.62 | 316 |
| 64 | 880 | 0.62 | 315 |
| 65 | 880 | 0.63 | 315 |
| 66 | 880 | 0.63 | 317 |
| 67 | 890 | 0.64 | 317 |
| 68 | 890 | 0.64 | 318 |
| 69 | 890 | 0.65 | 317 |
| 70 | 890 | 0.64 | 320 |
| 71 | 890 | 0.64 | 318 |
| 72 | 900 | 0.64 | 317 |
| 73 | 910 | 0.63 | 316 |
| 74 | 940 | 0.63 | 302 |
| 75 | 1010 | 0.62 | 293 |
| 76 | 880 | 0.63 | 325 |
| 77 | 880 | 0.62 | 323 |
| 78 | 880 | 0.64 | 322 |
| 79 | 880 | 0.65 | 318 |
| 80 | 890 | 0.65 | 320 |
| 81 | 890 | 0.66 | 322 |
| 82 | 890 | 0.65 | 322 |
| 83 | 900 | 0.64 | 319 |
| 84 | 900 | 0.64 | 320 |
| 85 | 910 | 0.63 | 315 |
| 86 | 910 | 0.63 | 313 |
| 87 | 950 | 0.61 | 293 |
| 88 | 980 | 0.59 | 285 |

Fig. 7

| Sample No. of Transformer | Sample No. of Composition | Pb (mol) | $Zn_{1/3}Nb_{2/3}$ x(mol) | Zr y(mol) | Ti z(mol) | x+y+z (mol) | Sn (wt%) | Mn (wt%) | Sintering Temp. (°C) | Conversion Efficiency (%) |
|---|---|---|---|---|---|---|---|---|---|---|
| 105 | 5 | 1.0 | 0.01 | 0.65 | 0.25 | 0.91 | 0 | 0 | 860 | 31 |
| 109 | 9 | 1.0 | 0.01 | 0.25 | 0.69 | 0.95 | 0 | 0 | 850 | 32 |
| 110 | 10 | 1.0 | 0.01 | 0.25 | 0.71 | 0.97 | 0 | 0 | 860 | 32 |
| 111 | 11 | 1.0 | 0.05 | 0.25 | 0.68 | 0.98 | 0 | 0 | 880 | 31 |
| 113 | 13 | 1.0 | 0.10 | 0.25 | 0.64 | 0.99 | 0 | 0 | 900 | 32 |
| 114 | 14 | 1.0 | 0.10 | 0.25 | 0.65 | 1.00 | 0 | 0 | 960 | - |

Fig. 8

| Sample No of Transformer | Sample No. of Composition | Pb (mol) | Zn₁/₃Nb₂/₃ x(mol) | Zr y(mol) | Ti z(mol) | x+y+z (mol) | SnO₂ (wt%) | MnO₂ (wt%) | Sintering Temp. (°C) | Conversion Efficiency (%) |
|---|---|---|---|---|---|---|---|---|---|---|
| 119 | 19 | 1.0 | 0.010 | 0.45 | 0.47 | 0.93 | 0 | 0 | 840 | 31 |
| 125 | 25 | 1.0 | 0.10 | 0.44 | 0.44 | 0.98 | 0 | 0 | 860 | 35 |
| 130 | 30 | 1.0 | 0.20 | 0.44 | 0.34 | 0.98 | 0 | 0 | 870 | 32 |
| 135 | 35 | 1.0 | 0.15 | 0.25 | 0.55 | 0.95 | 0 | 0 | 860 | 31 |
| 140 | 40 | 1.0 | 0.10 | 0.45 | 0.43 | 0.98 | 0 | 0 | 880 | 35 |
| 144 | 44 | 1.0 | 0.05 | 0.60 | 0.33 | 0.98 | 0 | 0 | 870 | 32 |
| 150 | 50 | 1.0 | 0.15 | 0.55 | 0.25 | 0.95 | 0 | 0 | 850 | 31 |
| 154 | 54 | 1.0 | 0.10 | 0.45 | 0.40 | 0.95 | 0 | 0 | 880 | 35 |
| 159 | 59 | 1.0 | 0.02 | 0.37 | 0.60 | 0.99 | 0 | 0 | 890 | 32 |

Fig. 9

| Sample No. of Transformer | Sample No. of Composition | Pb (mol) | $Zn_{1/3}Nb_{2/3}$ x(mol) | Zr y(mol) | Ti z(mol) | x+y+z (mol) | $SnO_2$ (wt%) | $MnO_2$ (wt%) | Sintering Temp. (°C) | Conversion Efficiency (%) |
|---|---|---|---|---|---|---|---|---|---|---|
| 172 | 72 | 1.0 | 0.10 | 0.55 | 0.33 | 0.98 | 1.9 | 0 | 900 | 37 |
| 173 | 73 | 1.0 | 0.10 | 0.55 | 0.33 | 0.98 | 2.0 | 0 | 910 | 37 |
| 174 | 74 | 1.0 | 0.10 | 0.55 | 0.33 | 0.98 | 2.1 | 0 | 940 | 37 |
| 175 | 75 | 1.0 | 0.10 | 0.55 | 0.33 | 0.98 | 2.3 | 0 | 1010 | - |
| 183 | 83 | 1.0 | 0.10 | 0.37 | 0.50 | 0.97 | 0 | 1.5 | 900 | 90 |
| 185 | 85 | 1.0 | 0.10 | 0.55 | 0.33 | 0.98 | 0 | 1.9 | 910 | 89 |
| 186 | 86 | 1.0 | 0.10 | 0.55 | 0.33 | 0.98 | 0 | 2.0 | 910 | 89 |
| 187 | 87 | 1.0 | 0.10 | 0.55 | 0.33 | 0.98 | 0 | 2.1 | 950 | - |
| 188 | 88 | 1.0 | 0.10 | 0.55 | 0.33 | 0.98 | 0 | 2.3 | 980 | - |

Fig. 10

| Sample No. of Transformer | Average Particle Diameter of Pulverized Powder (μm) | Strength to Break (MPa) |
|---|---|---|
| 201 | 0.4 | 67 |
| 202 | 0.6 | 100 |
| 203 | 1.0 | 110 |
| 204 | 1.5 | 105 |
| 205 | 1.8 | 68 |

Fig. 11

| Sample No. of Transformer | Hold Time at Maximum Temperature (h) | Average Crystal Grain Diameter (μm) | Strength to Break (MPa) |
|---|---|---|---|
| 206 | 1 | 1.5 | 50 |
| 207 | 1.5 | 2.0 | 105 |
| 208 | 2 | 3.0 | 110 |
| 209 | 4 | 4.0 | 100 |
| 210 | 6 | 4.5 | 78 |

PIEZOELECTRIC PORCELAIN COMPOSITION, LAMINATED PIEZOELECTRIC DEVICE THEREFROM AND PROCESS FOR PRODUCING THE SAME

TECHNICAL FIELD

The present invention relates to piezoelectric ceramic composition, a multi-layered piezoelectric device using the composition, such as a multi-layered piezoelectric actuator and a multi-layered piezoelectric transformer, and a method of manufacturing the device.

BACKGROUND ART

Piezoelectric ceramics is used widely for piezoelectric ceramic devices, such as piezoelectric resonators, piezoelectric filters, piezoelectric actuators, piezoelectric transformers, and piezoelectric buzzers. Multi-layered piezoelectric devices have been developed according to recent demand to have reduced size and thickness and to have high performance Conventional piezoelectric compositions are sintered at high sintering temperatures of about 1,200° C. The temperatures have the multi-layered piezoelectric devices include expensive platinum or palladium as material of internal electrodes, thus increasing production cost of the devices.

To decrease the sintering temperature of the ceramics, Japanese Patent Laid-Open Publication No.9-169566 discloses that the sintering temperature is reduced by adding Cu and W to composition essentially consisting of a perovskite-structure multiple oxide containing Pb, Zr, and Ti. The temperature allows relatively inexpensive silver-palladium alloys to be used as material of the internal electrodes of the piezoelectric devices.

To further reduce the sintering temperature and the content of palladium, Japanese Patent Laid-Open Publication No.10-7458 discloses that CoO and PbO are added to composition essentially consisting of $PbTiO_3$, $PbZrO_3$, $Pb(Mn_{1/3}Nb_{2/3})$ and $Pb(Co_{1/3}Nb_{2/3})$.

The piezoelectric ceramic composition disclosed in Japanese Patent Laid-Open Publication No.9-169566 is sintered at a sintering temperature of about 1,100° C. and has piezoelectric characteristics, e.g. a coupling coefficient Kp ranging about from 0.50 to 0.57.

The piezoelectric ceramic composition disclosed in Japanese Patent Laid-Open Publication No.10-7458 is sintered at a sintering temperature of about 900° C. and has piezoelectric characteristics, e.g. a coupling coefficient Kp ranging about from 0.30 to 0.50, and a Curie temperature, which indicates heat resistance, ranging about from 200° C. to 300° C.

As above, there has not been composition that has a sintering temperature of about 900° C., piezoelectric characteristics, e.g. a coupling coefficient Kp of at least 0.50, and a Curie temperature of at least 300° C. among the conventional ceramic compositions. The conventional compositions allow relatively inexpensive silver-palladium alloys to be used as the material of the internal electrodes, however, has poor characteristics as piezoelectric ceramics.

SUMMARY OF THE INVENTION

Composition for material of piezoelectric ceramics includes three components, $Pb(Zn_{1/3}Nb_{2/3})O_3$, $PbTiO_3$, and $PbZrO_3$, and has a basic composition formula of $Pb(Zn_{1/3}Nb_{2/3})_xZr_yTi_zO_3$, where $0.90<x+y+z<1.0$.

The composition has a low sintering temperature of about 900° C. and exhibits excellent piezoelectric characteristics and heat resistance. A multi-layered piezoelectric device using the composition may employ inexpensive silver or metals containing a higher proportion of silver as material of an internal electrode.

BRIEF DESCRIPTION OF THE DRAWINGS

FIG. 1 shows composition of piezoelectric ceramic composition in accordance with Exemplary Embodiment 1 of the present invention.

FIG. 2 shows characteristics of piezoelectric ceramic compositions in accordance with Embodiment 1.

FIG. 3 shows composition of piezoelectric ceramic compositions in accordance with Exemplary Embodiment 2 of the invention.

FIG. 4 shows characteristics of the compositions in accordance with Embodiment 2.

FIG. 5 shows composition of piezoelectric ceramic compositions in accordance with Exemplary Embodiment 3 of the invention.

FIG. 6 shows characteristics of the compositions in accordance with Embodiment 3.

FIGS. 7 through 9 show characteristics of multi-layered piezoelectric transformers and composition and characteristics of piezoelectric ceramic compositions, i.e. materials of the transformers in accordance with Exemplary Embodiment 4 of the invention.

FIGS. 10 and 11 show characteristics of multi-layered piezoelectric transformers in accordance with Exemplary Embodiment 5 of the invention.

DETAILED DESCRIPTION OF PREFERRED EMBODIMENTS

Exemplary Embodiment 1

Figure 12:
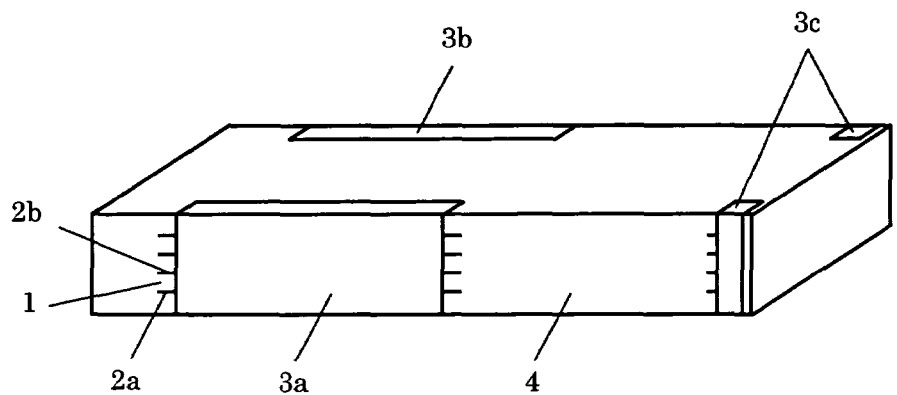
FIG. 12 is a perspective view of the transformer in accordance with Embodiments 4 and 5.

Piezoelectric ceramic compositions and a method of manufacturing the compositions in accordance with Exemplary Embodiment 1 of the present invention will be described.

First, powders of lead monoxide (PbO), titanium oxide ($TiO_2$), zirconium oxide ($ZrO_2$), zinc oxide (ZnO), and niobium oxide ($Nb_2O_5$) are weighed and formulated at molar ratios shown in FIG. 1 to prepare samples Nos. 1-16.

Next, these materials are put into a pot mill with water and partially-stabilized zirconia balls as a medium. The pot mill is rotated for 20 hours to wet-mix the materials. At this moment, the weight ratio of the materials and water is 1:1. The zirconia balls, the medium, have diameters not larger than 5 mm.

Next, slurry made by the wet mixing is transferred onto a stainless steel tray or the like and dried in a dryer at a temperature of 200° C. for a day and a night. The dried powder is granulated with a mortar or the like, and is then transferred into a crucible of alumina and fired at a maximum temperature of 850° C. (a increase/decrease rate of temperature is 200° C./hour), thus providing calcined powder.

Next, the calcined powder is granulated with a grinder, such as a rotor mill and a disk mill, and then, the granulated powder is wet-pulverized for 10 hours with a pot similar to that at the mixing. Then, the pulverized slurry is transferred in a stainless steel tray or the like and is dried in a drier at a temperature of 200° C. in a day and a night, thus providing pulverized powder, material of piezoelectric ceramics.

Next, binder containing polyvinyl alcohol is added to the pulverized powder, and the material is then pressed by a pressure of about 1,000 kg/cm$^2$, thus providing a disk-shaped mold having diameters of 20 mm and thicknesses of 1.3 mm.

Next, the mold is placed on a saggar of alumina, and heated in an electric furnace at a temperature of 500° C. for two hours to have the binder therein removed. Then, the mold is put into another electric furnace and kept at a predetermined sintering temperature for two hours to provide a sintered piezoelectric ceramics having a disk-shape.

Then, silver paste is applied on the piezoelectric ceramics having the disk-shape and dried, and then, is fired at a temperature of about 700° C. for 10 minutes to form electrodes. A voltage of 3 kV per a thickness of 1 mm is applied to the ceramics having the electrodes thereon in silicone oil at a temperature of 100° C. to polarize the ceramics. Thus, samples of Nos. 1-16 of piezoelectric ceramic elements are obtained. The ceramic elements after the polarization are left at a room temperature for at least 24 hours.

According to analysis, it is confirmed that each of the piezoelectric ceramic elements obtained in this manner includes three components, $Pb(Zn_{1/3}Nb_{2/3})O_3$, $PbTiO_3$, and $PbZrO_3$.

Each of the ceramic elements obtained in this manner was measured in piezoelectric characteristics, a coupling coefficient Kp and a Curie temperature, with an instrument, such as an impedance analyzer. The measurement values are shown in FIG. 2. Each of the sintering temperatures shown in FIG. 2 is the minimum sintering temperature at which piezoelectric ceramics having a density of at least 7.7 g/cm$^3$ is obtained. The values of the ceramics sintered at these respective sintering temperatures are shown.

A basic composition formula of each composition is expressed by $Pb(Zn_{1/3}Nb_{2/3})_xZr_yTi_zO_3$. An amount of Pb is "1", the molar ratio of $Zn_{1/3}Nb_{2/3}$ is "x", the molar ratio that of Zr is "y", and the molar ratio of Ti is "z".

As shown in FIGS. 1 and 2, the samples of Nos.5-7, 9-11, and 13 of the ceramic compositions, where $0.90<x+y+z<1.0$, have sintering temperatures not higher than 900° C., Curie temperatures not lower than 300° C., and coupling coefficients Kp not less than 0.50. Thus, the samples have sufficient heat resistance and piezoelectric characteristics.

The samples of Nos. 1-4, in which $x+y+z<0.90$, of the piezoelectric ceramic compositions have sintering temperatures not higher than 900° C., and Curie temperatures not lower than 300° C., however, has coupling coefficients Kp less than 0.50, thus not having excellent piezoelectric characteristics.

The samples of Nos. 8, 12 and 14-16, where $x+y+z \geq 1.0$ of the piezoelectric ceramic compositions have excellent coupling coefficients Kp not less than 0.50 and Curie temperatures not lower than 300° C., however has sintering temperatures higher than 900° C., thus not being preferable.

Exemplary Embodiment 2

Piezoelectric ceramic compositions in accordance with Exemplary Embodiment 2 of the present invention will be described. Piezoelectric ceramic compositions according to Embodiment 2 have a basic composition formula identical to that of Embodiment 1, i.e., $Pb(Zn_{1/3}Nb_{2/3})_xZr_yTi_zO_3$, where the molar ratio of $Zn_{1/3}Nb_{2/3}$ is "x", the molar ratio of Zr is "y", and the molar ratio of Ti is "x" when the amount of Pb is "1".

First, in a manner similar to that of Embodiment 1, materials, PbO, $TiO_2$, $ZrO_2$, ZnO, and $Nb_2O_5$ are weighed and formulated according to compositions shown in FIG. 3. The samples of Nos.17-62 of piezoelectric ceramic elements are provided in a manner similar to that of Embodiment 1, and characteristics of the samples were measured. The measurement values are shown in FIG. 4. Sintering temperatures shown in FIG. 4 are qualified similarly to that of Embodiment 1.

As shown as the results shown in FIGS. 3 and 4, the samples of Nos.20-29, 36-43, and 51-58, where $0.01<x<0.20$ (x being the molar ratio of $Zn_{1/3}Nb_{2/3}$), $0.25<y<0.60$ (y being the molar ratio of Zr), and $0.25<z<0.60$ (z being the molar ratio of Ti) have sintering temperatures not higher than 900° C., Curie temperatures not lower than 300° C., and coupling coefficients Kp not less than 0.55. Thus, piezoelectric characteristics more excellent than those of compositions in accordance with Embodiment 1 are obtained.

Exemplary Embodiment 3

Piezoelectric ceramic compositions in accordance with Exemplary Embodiment 3 will be described.

First, in a manner similar to that of Embodiment 1, materials, PbO, $TiO_2$, $ZrO_2$, ZnO, and $Nb_2O_5$ are weighed and formulated according to compositions shown in FIG. 5. Additive, $SnO_2$ and $MnO_2$ is weighed and added to this formulation according to compositions shown in FIG. 5. Then, the samples of Nos.63-88 of piezoelectric ceramic elements are obtained in a manner similar to that of Embodiment 1, and characteristics of the samples were measured. The measurement values are shown in FIG. 6. Sintering temperatures shown in FIG. 6 are qualified similarly to that of Embodiment 1.

As shown from the results shown in FIGS. 5 and 6, for the piezoelectric ceramic compositions of FIG. 5 including $SnO_2$ or $MnO_2$ added thereto in accordance with Embodiment 3 have Curie temperatures not lower than 300° C. and coupling coefficients Kp not less than about 0.6. Thus, piezoelectric characteristics more excellent than those of the compositions of the second exemplary embodiment are obtained.

In particular, the samples of Nos. 63-73 including $SnO_2$ not more than 2.0 wt %, and the samples of Nos. 76-86 including $MnO_2$ not more than 2.0 wt % have Curie temperatures not lower than 300° C. and coupling coefficients Kp ranging from 0.62 to 0.66. In addition to extremely excellent piezoelectric characteristics, the samples have sintering temperatures not higher than 900° C.

According to Embodiment 3, only one of $SnO_2$ and $MnO_2$ is added as the additive. However, the compositions may include both $SnO_2$ and $MnO_2$ added so that the total amount of them is the same as the amount of either $SnO_2$ or $MnO_2$ added separately. The compositions have the same effect.

According to Embodiment 3, $SnO_2$ is added in order to add Sn into the compositions. However, the compound of Sn, such as SnO and $SnCl_2$, may be added instead of $SnO_2$. Sn is oxidized at calcining and firing and thus contained in the piezoelectric ceramics as oxides of Sn, providing the same effect. An amount of $SnO_2$ into which the amount of the compound of Sn is converted as to allow the amount of $SnO_2$ to include the same amount of Sn in the compound is the same amount, i.e., not more than 2.0 wt. %, thereby providing the same effect.

$MnO_2$ is added in order to add Mn to the compositions. However, compound of Mn, such as $Mn_3O_4$ and $MnCO_3$, can be added besides $MnO_2$. Mn is oxidized in the calcining and firing and thus contained in the piezoelectric ceramics as oxides of Mn, providing the same effect. An amount of $MnO_2$ into which the amount of the compound of Mn is converted as to allow the amount of $MnO_2$ to include the same amount of Mn in the compound of is the same, i.e., not more that 2.0 wt. %, thereby providing the same effect.

Exemplary Embodiment 4

A multi-layered piezoelectric transformer as a multi-layered piezoelectric device according to Exemplary Embodiment 4 including piezoelectric ceramic compositions of Embodiments 1-3, and a method of manufacturing the transformer will be described.

Figure 13:
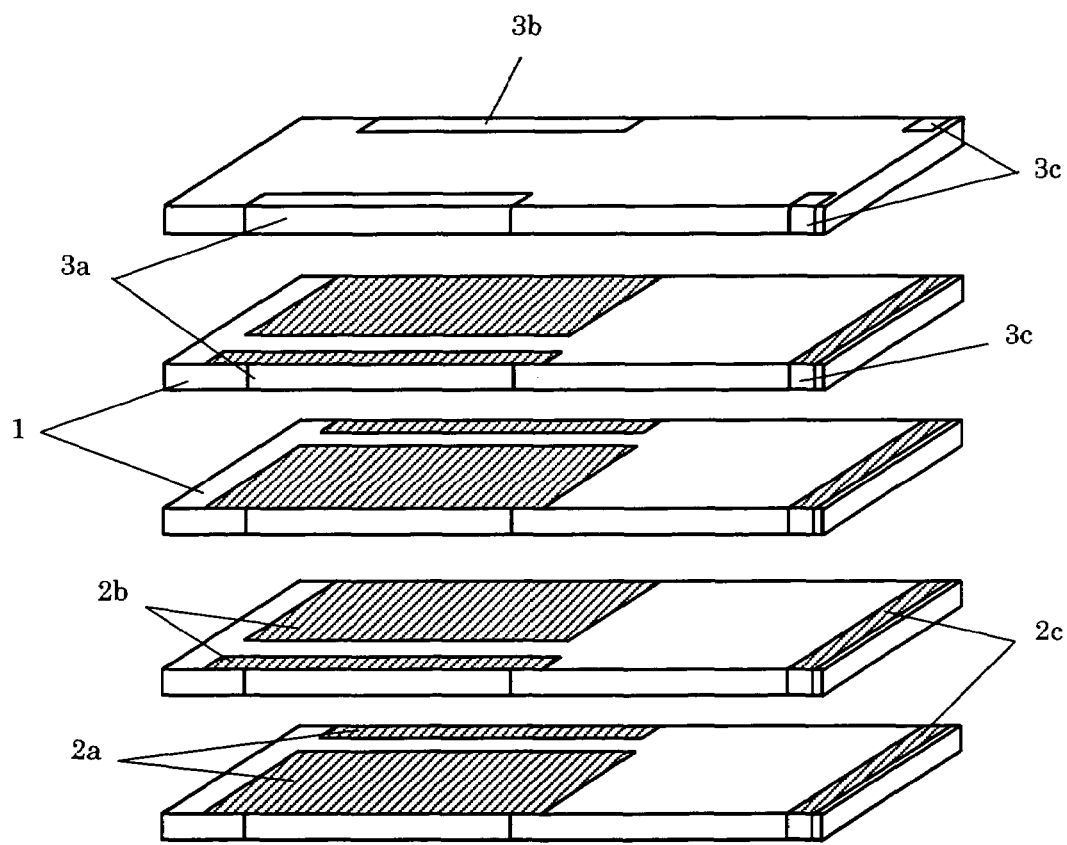
FIG. 13 is an exploded perspective view of the transformer in accordance with Embodiments 4 and 5.

FIG. 12 is a perspective view of the multi-layered piezoelectric transformer in accordance with Embodiment 4. FIG. 13 is an exploded perspective view of the transformer. The transformer includes piezoelectric ceramic layers 1, internal electrodes 2a and 2b for input, internal electrodes 2c for output, external electrodes 3a and 3b for input, external electrode 3c for output, and piezoelectric ceramics 4.

First, in a manner similar to that of Embodiments 1-3, pulverized powder of material of piezoelectric ceramics is obtained. The pulverized powder is mixed with organic binder, plasticizer, and organic solvent to provide slurry. Then, the slurry is formed into a sheet by a doctor blade method to provide a piezoelectric ceramic sheet for the piezoelectric ceramic layers.

Paste is prepared to form the internal electrodes. The paste includes silver powder, as metal powder, having an average particle diameter of 1.5 µm. The paste for the internal electrodes includes 100 parts by weight of the metal powder, 40 parts by weight of the pulverized powder of the material of the ceramics having the same composition as the ceramic sheet, and 15 parts of $ZrO_2$.

Silver powder having a small average particle diameter, e.g. not larger than 0.2 µm, allows silver to diffuse into a grain boundary of the ceramic layer during the firing. The diffusing silver decreases strength to deflecting of the ceramic layer and vanishes the internal electrode. Thus, silver powder having an average particle diameter of 1.5 µm is used.

The pulverized powder of the material of the ceramics added to the paste for internal electrodes increases a bonding strength between the internal electrodes and the ceramic layers. As a result, the multi-layered piezoelectric device has strength to breaking more than a device including paste without the pulverized powder.

Reaction between $ZrO_2$ and the piezoelectric ceramics in the paste for internal electrodes relatively decreases sintering property of a portion of the piezoelectric ceramics around the internal electrodes. As a result, the amount of internal electrodes diffusing into the ceramic layers during firing decreases. Thus, the strength to breaking of the ceramic layers is prevented from declining. Instead of $ZrO_2$, compounds of Zn, Nb, Ti, Sn, and Mn, such as ZnO, $Nb_2O_5$, $TiO_2$, $SnO_2$, and $MnO_2$, may be added as inorganic additives, providing the same effect.

Then, patterns of the internal electrodes are printed on the ceramic sheet with the paste for internal electrodes, thus providing patterns of the internal electrodes 2a and 2c, as shown in FIG. 13. The patterns of the internal electrodes have average thicknesses not less than 4 µm after the firing.

Next, another piezoelectric ceramic sheet is placed on the ceramic sheet having the patterns of the internal electrodes thereon, and then the two sheets are pressed. Patterns of internal electrodes are printed, with the paste for internal electrodes to form patterns of the internal electrodes 2b and 2c, as shown in FIG. 13. Then, stacking and pressing piezoelectric ceramic sheets and forming internal electrodes are repeated in a similar manner, providing desired characteristics. Further, a piezoelectric ceramic sheet is stacked on these sheets and pressed. Then, the stacked ceramic sheets are pressed at a pressure several times the previous pressure and cut into chips having predetermined sizes, thus providing substantially a rectangular multi-layered body.

Next, the multi-layered body is heated at a temperature ranging from 80° C. to 200° C. for 20 hours to remove the plasticizer. Further, the multi-layered body is heated at a high temperature of 400° C. for 20 hours to remove the organic binder. Then, the multi-layered body is maintained in a sintering temperature within the maximum temperature ranging from 850° C. to 1,010° C. for two hours to be sintered, thus providing a sintered body for the transformer.

Next, the sintered body is barrel-polished to expose the internal electrodes 2a, 2b, and 2c, and then, silver paste containing glass frit is applied on predetermined positions on the sintered body and dried. Then, the sintered body is fired at temperatures of about 700° C. for 10 minutes to form the external electrodes 3a, 3b, and 3c.

Then, an electric field of 3 kV/mm is applied across the external electrodes 3a and 3b in silicone oil at a temperature of 100° C. for 30 minutes to polarize the ceramic layer between the internal electrodes 2a and 2b. Then, an electric field of 2 kV/mm is applied across the external electrodes 3a, 3b, and 3c for 30 minutes to polarize the piezoelectric ceramics 4 between the internal electrodes 2a and 2c and between the internal electrodes 2b and 2c, thus providing a multilayer piezoelectric transformer shown in FIG. 12.

The multi-layered piezoelectric transformer has a length of 30 mm, a thickness of 2.4 mm, and a width of 5.5 mm. The transformer includes five piezoelectric ceramic layers and four layers of the internal electrodes. Each of the internal electrodes 2a and 2b has a length of 18 mm. The ceramic layer 1 has a thickness of 0.48 mm.

Characteristics of the piezoelectric transformers manufactured in this manner are evaluated. In the evaluation, in each of samples, a load resistance having a resistance of 100 kΩ is connected to the external electrode 3c for output, and an alternating voltage is applied across the external electrodes 3a and 3b for input. A conversion efficiency, i.e. the rate of an output power to an input power, is measured.

An alternating voltage that operates in a $\lambda/2$ mode and has a resonant frequency ranging from 55 kHz to 66 kHz is applied to each multi-layered piezoelectric transformer. The input power is 4W.

The conversion efficiency of the multi-layered piezoelectric transformers is shown in FIGS. 7, 8, and 9 together with sample numbers of the piezoelectric ceramic composition corresponding to each sample, and compositions of the samples and sintering temperatures. In samples having no value of conversion efficiency, faulty connection of the internal electrodes 2a, 2b, and 2c is caused by excessive sintering or melting of the internal electrodes, and thus the piezoelectric characteristics cannot be measured between the external electrodes 3a and 3b.

As shown in FIGS. 7, 8 and 9, each of the transformers using the piezoelectric ceramic compositions according to Embodiments 1 to 3, i.e. the ceramic compositions having a basic composition formula of $Pb(Zn_{1/3}Nb_{2/3})_xZr_yTi_zO_3$, where $0.9<x+y+z<1.0$, can be fired at a temperature not higher than 910° C. The internal electrodes, upon including silver as metal thereof provide a multi-layered piezoelectric transformer with no internal structural defects, e.g. faulty connection of the internal electrodes and peeling of the layers of the internal electrode layers.

In contrast, each of the transformers including the piezoelectric ceramic compositions which do not have excellent characteristics described in Embodiments 1 to 3 exhibits a sintering temperature not lower than 950° C. Abnormal shrinkage or melting of the internal electrodes causes faulty connection of the internal electrodes. For this reason, these piezoelectric ceramic compositions are unsuitable for multi-layered piezoelectric devices including internal electrodes containing silver or a high percentage of silver as metal.

As shown in FIG. 9, transformers particularly including the piezoelectric ceramic compositions of Embodiment 3, i.e. the piezoelectric ceramic compositions each having a basic composition formula of $Pb(Zn_{1/3}Nb_{2/3})_xZr_yTi_zO_3$, where $0.01<x<0.20$, $0.25<y<0.60$, $0.25<z<0.60$, and $0.90<x+y+z<1.0$, and including an amount of compound of Mn equivalent to 2.0 wt % of $MnO_2$, have a high conversion efficiency. This is because of the following reason.

A piezoelectric ceramic composition having the compounds of Mn added thereto has an extremely small electric loss tangent ($\tan\delta$) as its characteristics. As a result, the multi-layered piezoelectric transformer has an extremely small electric loss and a high conversion efficiency. Devices, such as a piezoelectric transformer, a piezoelectric resonator, and piezoelectric filter, utilizing a resonance frequency or frequencies around the resonance frequency has a performance influenced by the electric loss tangent. Devices, such as a piezoelectric actuator and piezoelectric buzzer, utilizing frequencies out of the resonance frequency has performance influenced little by the electric loss tangent.

According to Embodiment 4, the internal electrodes employ silver as metal component thereof for reducing a cost of the material of the internal electrodes. The electrodes may include relatively-inexpensive silver-palladium alloys essentially consisting of silver as the material of the electrodes, thereby providing a multi-layered piezoelectric transformer similar to those described above.

Exemplary Embodiment 5

A multi-layered piezoelectric transformer as a multi-layered piezoelectric device in accordance with Exemplary Embodiment 5.

First, an influence of an average particle diameter of pulverized powder of piezoelectric ceramic material on mechanical strength of the transformer will be discussed.

Calcined powder of piezoelectric ceramic composition of a sample of No.76 of Embodiment 3 is prepared in a manner similar to that of Embodiment 1. After the calcined powder is granulated, five kinds of pulverized powder having average particle diameters different from each other are obtained by wet-pulverizing the granulated powder for five kinds of different periods of time. These five kinds of pulverized powder provide five kinds of piezoelectric ceramic sheets in a manner similar to that of Embodiment 4. For each of these five kinds of piezoelectric ceramic sheets, lamination and press of the ceramic sheets, formation of internal electrodes, and press and cut of the multi-layered sheets are performed by procedures and conditions similar to those of Embodiment 4. Thus, multi-layered bodies are provided. These multi-layered bodies are fired at a maximum temperature of 880° C. for two hours, thus providing five kinds of multi-layered piezoelectric transformers.

For each of the five kinds of transformers produced in this manner, strength to breaking in its thickness direction is measured by a three-point bending test method for evaluation. The measurement results are shown in FIG. 10.

As shown in FIG. 10, the average particle diameters of the pulverized powder is controlled within a predetermined range to improve the strength. Each of the transformers employing the pulverized powder having an average particle diameter ranging from 0.6 μm to 1.5 μm has sufficient strength to braking. Pulverized powder having an average particle diameter not larger than 0.4 μm has a large specific surface area. As a result, internal electrodes significantly diffuse into the grain boundary during firing, thereby making the strength decline. An average particle diameter not smaller than 1.8 μm does not allow the powder to be fired sufficiently, thereby making the strength decrease.

Next, the influence of an average crystal grain diameter of a piezoelectric ceramic layer on the mechanical strength of the transformer will be discussed.

First, pulverized powder having an average particle diameter of 1.0 μm of a sample of No.76 of the piezoelectric ceramic composition of Embodiment 3 is prepared in a manner similar to that of Embodiment 1. Using this pulverized powder, lamination and press of the piezoelectric ceramic sheets, formation of internal electrodes, and press and cut of the ceramic sheets are performed by a procedure similar to that of Embodiment 4. Thus, multi-layered bodies each having substantially rectangular shapes are provided. Five kinds of multi-layered piezoelectric transformers are produced by keeping these multi-layered bodies at a maximum temperature of 880° C. for five different periods of time ranging from one hour to six hours during firing. The ceramic layers of these transformers have average crystal grain diameters different from each other.

For each of the five kinds of multi-layered piezoelectric transformers manufactured in this manner, the strength to breaking in its thickness direction is measured by the three-point bending test method for evaluation. The measurement results are shown in FIG. 11.

As shown in FIG. 11, the average crystal grain diameters of the ceramic layers are controlled within a predetermined range to improve the strength to breaking. Each of the transformers having an average crystal grain diameter ranging from 2.0 μm to 4.0 μm has sufficient strength to breaking. Powder having an average crystal grain diameter of 1.5 μm is not sintered insufficiently, hence decreasing the strength to breaking largely. An average crystal grain diameter of 4.5 μm allows silver in the internal electrodes to considerably diffusing into the ceramic grain boundary according to growth of ceramic crystal grains, thus decreasing the strength to breaking.

INDUSTRIAL APPLICABILITY

As described above, according to the present invention, a piezoelectric ceramic composition that has excellent piezoelectric characteristics and heat resistance with a low sintering temperature of 900° C., a coupling coefficient Kp not less than 0.50, and a Curie temperature not lower than 300° C. is provided. The composition allows inexpensive silver and relatively-inexpensive silver-palladium alloys containing a high percentage of silver to be used as material of internal electrodes. Thus, an inexpensive piezoelectric device having excellent characteristics can be obtained.

The invention claimed is:

1. A method of manufacturing a piezoelectric device comprising: providing material of composition consisting essentially of three components, $Pb(Zn_{1/3}Nb_{2/3})O_3$, $PbTiO_3$, and $PbZrO_3$, and having a basic composition formula of $Pb(Zn_{1/3}Nb_{2/3})_xZr_yTi_zO_3$, where $0.97 \leqq x+y+z<1.0$;
firing the material;
pulverizing the fired material so that the pulverized material has an average particle diameter ranging from 0.6 μm to 1.5 μm;
making a ceramic sheet from the pulverized material;
making a multilayer body by stacking the ceramic sheet and paste containing silver;
and sintering the multilayer body at a temperature not higher than 900° C.

2. The method of claim 1, wherein an average crystal grain diameter of a sintered body obtained at said sintering of the multilayer body ranges from 2 μm to 4 μm.

3. The method of claim 1, wherein the paste includes powder obtained in said pulverizing of the fired material.

4. The method of claim 3, wherein the paste further includes compound containing at least one of Zn, Nb, Ti, Zr, Sn, and Mn.

5. The method of claim 1, wherein $0.01<x<0.20$, $0.25<y<0.60$, and $0.25<z<0.60$.

6. The method of claim 1, wherein said sintering the multilayer body comprises sintering the multilayer body as to allow the ceramic layer to have a density not less than 7.7 g/cm³.

7. The method of claim 1, wherein said sintering the multilayer body comprises sintering the multilayer body as to allow the ceramic layer to have a Curie temperature not lower than 300° C.

8. The method of claim 1, wherein said sintering the multilayer body comprises sintering the multilayer body as to allow the ceramic layer to have a coupling coefficient not less than 0.5.

9. The method of claim 1, wherein said sintering the multilayer body comprises sintering the ceramic sheet together with the paste.

* * * * *